United States Patent
Kurganova et al.

(10) Patent No.: US 11,467,486 B2
(45) Date of Patent: Oct. 11, 2022

(54) GRAPHENE PELLICLE LITHOGRAPHIC APPARATUS

(71) Applicant: ASML NETHERLANDS B.V., Veldhoven (NL)

(72) Inventors: Evgenia Kurganova, Nijmegen (NL); Adrianus Johannes Maria Giesbers, Vlijmen (NL); Alexander Ludwig Klein, Eindhoven (NL); Maxim Aleksandrovich Nasalevich, Eindhoven (NL); Arnoud Willem Notenboom, Rosmalen (NL); Mária Péter, Eindhoven (NL); Pieter-Jan Van Zwol, Eindhoven (NL); David Ferdinand Vles, Eindhoven (NL); Sten Vollebregt, s'-Gravenhage (NL); Willem-Pieter Voorthuijzen, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 98 days.

(21) Appl. No.: 16/969,211

(22) PCT Filed: Feb. 7, 2019

(86) PCT No.: PCT/EP2019/052997
§ 371 (c)(1),
(2) Date: Aug. 12, 2020

(87) PCT Pub. No.: WO2019/170356
PCT Pub. Date: Sep. 12, 2019

(65) Prior Publication Data
US 2020/0406244 A1    Dec. 31, 2020

(30) Foreign Application Priority Data

Mar. 9, 2018 (EP) .................................... 18160866
Dec. 14, 2018 (EP) .................................... 18212646

(51) Int. Cl.
*G03F 1/62* (2012.01)
*G03F 7/20* (2006.01)

(52) U.S. Cl.
CPC ............ *G03F 1/62* (2013.01); *G03F 7/70983* (2013.01)

(58) Field of Classification Search
CPC ..................................... G03F 1/62; G03F 1/64
USPC .............................................................. 430/5
See application file for complete search history.

(56) References Cited

U.S. PATENT DOCUMENTS

| 10,007,176 B2 | 6/2018 | Tu et al. |
| 2009/0110627 A1 | 4/2009 | Choi et al. |
| 2012/0161098 A1 | 6/2012 | Hiura et al. |
| 2014/0162021 A1 | 6/2014 | Fujii et al. |
| 2014/0174640 A1 | 6/2014 | Wenxu et al. |
| 2014/0295080 A1 | 10/2014 | Cho et al. |
| 2014/0370295 A1 | 12/2014 | Choi et al. |
| 2015/0353362 A1 | 12/2015 | Won et al. |
| 2017/0121177 A1 | 5/2017 | Silva et al. |
| 2017/0205705 A1 | 7/2017 | Ma et al. |
| 2018/0059535 A1 | 3/2018 | Tu et al. |
| 2020/0406244 A1 | 12/2020 | Kurganova et al. |

FOREIGN PATENT DOCUMENTS

| EP | 1150139 | 10/2001 |
| EP | 1348984 | 10/2003 |
| EP | 2068326 | 6/2009 |
| EP | 3762142 | 1/2021 |
| KR | 10-2012-0010643 | 2/2012 |
| KR | 10-2012-0099923 | 9/2012 |
| WO | 2017067813 | 4/2017 |
| WO | 2019170356 | 9/2019 |

OTHER PUBLICATIONS

International Search Report and Written Opinion issued in corresponding PCT Patent Application No. PCT/EP2019/052997, dated Jul. 26, 2019.
Netherlands Search Report and Written Opinion issued in corresponding Netherlands Patent Application No. 2022525, dated Jan. 14, 2021.

*Primary Examiner* — Christopher G Young
(74) *Attorney, Agent, or Firm* — Pillsbury Winthrop Shaw Pittman LLP

(57) ABSTRACT

A catalyst including: a first layer including a transition metal; a base layer; and an interlayer, wherein the interlayer is disposed between the base layer and the first layer is disclosed. Also disclosed are methods for preparing a catalyst as well as for synthesizing graphene, a pellicle produced using the catalyst or methods disclosed herein, as well as a lithography apparatus including such a pellicle.

21 Claims, 2 Drawing Sheets

GRAPHENE PELLICLE LITHOGRAPHIC APPARATUS

CROSS-REFERENCE TO RELATED APPLICATIONS

This application is the U.S. national phase entry of PCT Patent Application No. PCT/EP2019/052997, which was filed on Feb. 7, 2019, which is based upon and claims the benefit of priority of European Patent Application No. 18160866.2, which was filed on Mar. 9, 2018, and of European Patent Application No. 18212646.6, which was filed on Dec. 14, 2018 which are incorporated herein in their entireties by reference.

FIELD

The present invention relates to a catalyst. In particular, the present invention relates to a catalyst for producing graphene, wherein the graphene produced is suitable for use in a EUV reticle. The present invention also relates to capping a pellicle with boron nitride.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In the lithographic apparatus, EUV radiation is generated by the ionisation of liquid tin droplets by a radiation source, such as a laser. The liquid tin droplets are passed in front of the radiation source and as the radiation hits the tin droplets, the tin droplets are ionised and release EUV radiation. One issue associated with generating EUV radiation in this way is that the tin may contaminate various parts of the lithographic apparatus, such as the patterning device.

A patterning device suitable for use in a lithography apparatus may be a reticle. Reticles may become contaminated with particles or contaminants from inside the lithography apparatus. The particles may contaminate one or more of the front side of the reticle, the back side of the reticle, and the sides and/or edges of the reticle. The particles may be generated by the interaction of clamps on the sides of the reticle or may be from any other source, such as inorganic contaminants derived from the gases used in the lithographic apparatus, resist debris sputtered from the substrate during exposure, or mechanical contact between parts of the apparatus. The contaminants may comprise metal or metal oxide particles.

The problem of reticle contamination is particularly relevant to extreme ultraviolet (EUV) lithography. Protective elements may normally be used to protect the reticle from contamination within the lithography apparatus. However, in EUV lithography, due to the wavelength of the EUV radiation used, certain protective elements cannot be used.

Protective elements can include pellicles. Pellicles are thin, generally transparent (to at least EUV radiation) membranes, which prevent contamination of the EUV reticle. A pellicle that is suitable for use with EUV radiation is required to have high EUV transparency such that the EUV radiation is not absorbed by the EUV pellicle. An EUV pellicle is also required to have high thermal resistance. An EUV pellicle is also required to have high strength. EUV pellicles may break during use due to the high temperatures experienced by the EUV pellicle.

Graphene has been found to be a useful material for incorporation into EUV pellicles, due to its low absorbance of EUV radiation, and strength properties. In addition, graphene EUV pellicles can be produced as very thin membranes. However, the strength of the thin graphene membrane depends on the uniformity of the graphene surface, and the uniformity of thickness of the thin graphene membrane. Rough graphene surface layers and variations in thickness can introduce weak points into the graphene membrane structure. Weak points in the graphene membrane can cause the thin graphene membrane to break, and therefore require more frequent replacement.

Since the discovery of graphene, several approaches to produce high quality material way have been explored. Existing methods for synthesising single-layer graphene and few-layer graphene membranes include carbon vapour deposition (CVD), wherein a carbon source is deposited onto a surface. The challenge has been, however, to provide surfaces on which thin layer graphene membranes, comprising a plurality of layers, can be grown quickly and reliably.

Molybdenum catalysts supported on a silicon wafer have been used in the synthesis of graphene layers. Compared to other transition metals, molybdenum provided a thermal expansion co-efficient comparable to silicon, resulting in less thermal stress. The silicon wafers have also been thermally oxidised, such that the molybdenum is supported on a thin silicon dioxide surface layer (also known as a thermal oxide layer) of the silicon wafer. Although the exact catalytic mechanism is unclear, when the catalyst is in use, the molybdenum is converted into molybdenum carbide, which it is believed then acts as a catalyst.

However, current methods for producing graphene layers for use in EUV pellicles generally results in non-smooth graphene surfaces, variable thickness membranes, and irregular, heterogeneous morphologies. This makes graphene produced with known catalysts and using known methods less suitable for use as EUV pellicles.

There is therefore a need to produce graphene having high surface uniformity and high thickness uniformity. Furthermore, there is a need to provide wafer-scale graphene which is free of defects throughout the graphene layers. Graphene membranes with such properties have suitably high thermal stabilities, are suitably EUV transparent and have high strength to be used in an EUV pellicle.

It is therefore desirable to provide an improved method for the production of graphene which is suitable for use as a pellicle.

Pellicles may be etched in an atmosphere which contains free radical species, such as H* and HO*, and thereby can degrade over time with use. Since pellicles are very thin, the reaction with the free radical species can weaken the pellicle and ultimately cause it to fail.

It is therefore desirable to provide a pellicle which has improved chemical and thermal stability compared to known pellicles.

Whilst the present application generally refers to pellicles in the context of lithography apparatus, in particular EUV lithography apparatus, the invention is not limited to only pellicles and lithography apparatus and it is appreciated that the subject matter of the present invention may be used in any other suitable apparatus or circumstances.

For example, the methods of the present invention may equally be applied to spectral purity filters. Practical EUV sources, such as those which generate EUV radiation using a plasma, do not only emit desired 'in-band' EUV radiation, but also undesirable (out-of-band) radiation. This out-of-band radiation is most notably in the deep UV (DUV) radiation range (100 to 400 nm). Moreover, in the case of some EUV sources, for example laser produced plasma EUV sources, the radiation from the laser, usually at 10.6 microns, presents a significant out-of-band radiation.

In a lithographic apparatus, spectral purity is desired for several reasons. One reason is that resist is sensitive to out of-band wavelengths of radiation, and thus the image quality of patterns applied to the resist may be deteriorated if the resist is exposed to such out-of-band radiation. Furthermore, out-of-band radiation infrared radiation, for example the 10.6 micron radiation in some laser produced plasma sources, leads to unwanted and unnecessary heating of the patterning device, substrate, and optics within the lithographic apparatus. Such heating may lead to damage of these elements, degradation in their lifetime, and/or defects or distortions in patterns projected onto and applied to a resist-coated substrate.

A typical spectral purity filter may be formed, for example, from a silicon foundation structure (e.g. a silicon grid, or other member, provided with apertures) that is coated with a reflective metal, such as molybdenum. In use, a typical spectral purity filter might be subjected to a high heat load from, for example, incident infrared and EUV radiation. The heat load might result in the temperature of the spectral purity filter being above 800° C. Delamination and degradation of the silicon foundation structure is accelerated by the presence of hydrogen, which is often used as a gas in the environment in which the spectral purity filter is used in order to suppress debris (e.g. debris, such as particles or the like), from entering or leaving certain parts of the lithographic apparatus. Thus, the spectral purity filter may be used as a pellicle, and vice versa. Therefore, reference in the present application to a 'pellicle' is also reference to a 'spectral purity filter'. Although reference is primarily made to pellicles in the present application, all of the features could equally be applied to spectral purity filters.

In a lithographic apparatus (and/or method) it is desirable to minimise the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimise the amount of undesirable radiation (e.g. out-of-band) radiation that is passing through the lithographic apparatus and which is incident upon the substrate. Furthermore, it is desirable to ensure that a spectral purity filter used in a lithographic method or apparatus has an adequate lifetime, and does not degrade rapidly over time as a consequence of the high heat load to which the spectral purity filter may be exposed, and/or the hydrogen (or the like, such as free radical species including H* and HO*) to which the spectral purity filter may be exposed. It is therefore desirable to provide an improved (or alternative) spectral purity filter, and for example a spectral purity filter suitable for use in a lithographic apparatus and/or method.

SUMMARY

The present invention has been made in consideration of the aforementioned problems with known catalysts and methods for producing graphene pellicles.

According to a first aspect of the present invention, there is provided a catalyst comprising: (i) a first layer comprising a transition metal; (ii) a base layer; and (iii) an interlayer, wherein the interlayer is disposed between the base layer and the first layer. The transition metal may e.g. be selected from the group Mo, W, Pt, Cu and Ni.

Without wishing to be bound by theory, it is thought that irregularities in graphene, such as surface defects and variable thicknesses, are caused by poor surface uniformity of the catalyst used during synthesis. The first layer of the catalyst comprises the active catalytic agent or catalytic agent precursor. The present invention provides an interlayer that is disposed between the base layer and the first layer, which affords a smoother surface of the catalytic second layer, and therefore higher quality graphene.

In some embodiments the interlayer may comprise a metal oxide. Preferably the interlayer comprises zirconium dioxide.

It has been found that zirconium dioxide demonstrates the greatest benefits, whereas oxides of other metals such as titanium, hafnium, copper, aluminium, manganese, and silver, demonstrate somewhat lesser benefits.

Without wishing to be bound by theory, it is thought that the crystal structure of the interlayer provides a favorable lattice surface with which the crystal structure of the molybdenum may interact. In particular, it is thought that the presence of the interlayer between the substrate and the molybdenum provides a surface with a reduced number of defects. In addition, without wishing to be bound by theory, it is thought that the zirconium dioxide may interact with the molybdenum and act as a co-catalyst. The interlayer influences the growth of molybdenum during deposition of molybdenum when the catalyst is being produced. The interlayer also influences the formation of molybdenum carbide. The interlayer also influences the growth of graphene on the catalyst. Multilayer graphene has been found to grow more quickly on a catalyst comprising an interlayer compared to a known catalyst comprising a molybdenum layer on a Si substrate, which may itself comprise a silicon dioxide layer.

Alternatively or additionally, the interlayer may comprise a metal silicide. The metal silicide may be a silicide of any suitable metal, but is preferably molybdenum silicide. The presence of a metal silicide, specifically molybdenum silicide, interlayer has been found to accelerate growth of a graphene multilayer on the catalyst.

The interlayer may also additionally or alternatively comprise carbon. The carbon may be amorphous carbon (a-C). It has been surprisingly found that the amorphous carbon will be converted to graphene on heating to from around 800° C. to around 1000° C., preferably around 900° C., when deposited on a molybdenum catalyst.

In some embodiments, the base layer comprises silicon. The silicon may also comprise silicon dioxide. The silicon dioxide may be in a layer. The interlayer preferably is disposed on the silicon or silicon dioxide layer.

The first layer may comprise a transition metal, e.g. selected from the group Mo, W, Pt, Cu and Ni.

In an embodiment, the first layer may comprise metallic or elemental molybdenum. The first layer may comprise molybdenum carbide. Where the first layer comprises metallic or elemental molybdenum, when the catalyst is in use to produce graphene, the molybdenum will form molybdenum carbide. As such, reference to a first layer comprising molybdenum covers both the case where the molybdenum is in its metallic or elemental form as well as the case where the molybdenum is in its molybdenum carbide form, or any intermediate position.

In a second aspect of the present invention, there is provided a method of preparing a catalyst comprising the steps of: (i) providing an interlayer comprising a metal oxide, metal silicide, and/or carbon on a base layer; and (ii) providing a first layer comprising a transition metal, e.g. selected from the group Mo, W, Pt, Cu and Ni.

Preferably, the interlayer comprises zirconium. Preferably, the interlayer comprises zirconium dioxide.

In an embodiment, the interlayer comprises molybdenum silicide.

In an embodiment, the interlayer comprises carbon, preferably amorphous carbon (a-C).

The interlayer may be formed by sputtering, chemical vapour deposition, or any other suitable method. The interlayer may be provided by sputtering from a zirconium target, a zirconium oxide target, or by cross sputtering. The interlayer may be provided by sputtering zirconium whilst in the presence of oxygen. The oxygen may be in any suitable form such as neutral or ionized gas or plasma.

The first layer may be formed by sputtering, chemical vapour deposition, or any other suitable method.

The base layer may be any base layer disclosed herein. The base layer preferably comprises silicon, although any other suitable base layer may be used.

According to a third aspect of the present invention, there is provided a method of synthesizing graphene comprising the steps of: depositing carbon onto a surface of a catalyst according to the first aspect of the present invention or prepared by a method according to the second aspect of the present invention; and forming a graphene layer on the catalyst.

Whilst catalysts for producing graphene are known, it has been surprisingly found that a catalyst comprising an interlayer of a metal oxide or silicide offers improved performance. In experiments using the same conditions, such as temperature, pressure, and carbon source, it was found that the thickness of the multilayer graphene layer was around 6.5 nm after 90 minutes when using a catalyst of the prior art. In contrast, a catalyst according to the present invention formed a multilayer graphene layer with a thickness of between around 17 and around 18.5 nm after 90 minutes under the same conditions. In addition, the graphene was significantly more uniform when grown on a catalyst according to the present invention compared to the graphene grown on a prior-art catalyst. In addition, XRD studies have determined that the zirconium dioxide layer influences the growth of the molybdenum layer resulting in higher crystal orientation when compared to growing the molybdenum layer without the interlayer. It is believed that this at least partially provides the improved performance demonstrated by the catalyst according to the present invention.

In some embodiments of the method according to the third aspect of the present invention, the base layer comprises silicon. In some embodiments, the base layer further comprises silicon dioxide. In some embodiments, one or more of the first layer and the interlayer are formed by means of sputtering.

The method may further comprise removing the graphene from the surface of the catalyst. The multilayer graphene produced is more uniform in thickness compared to multilayer graphene produced using the catalysts of the prior art. This makes the multilayer graphene produced using the catalyst or methods of the present particularly suitable for use in a pellicle, such as an EUV pellicle.

In some embodiments, the carbon source is provided as a carbonaceous gas or as a stream of carbon. Any suitable carbonaceous gas may be used, such as, for example, hydrocarbon gas, such as methane or ethane. The carbonaceous gas may be saturated or unsaturated. Unsaturated gases include ethene and ethyne, which may be particularly desirable due to their increased reactivity and lower hydrogen content. The temperature and pressure used may be selected from any suitable parameters, which would be known to the skilled person.

The carbon may be deposited by means of carbon vapour deposition. The carbon may be deposited at any suitable temperature. Suitable temperatures may range from around 700° C. to around 1000° C.

It has been surprisingly realized that it is possible to grow a graphene layer on a catalyst without using chemical vapour deposition. In conventional methods, graphitic multilayers are grown on a catalyst at temperatures in the range of around 800° C. to around 1000° C. The carbon is provided via a carbon-containing gas, such as methane, in the presence of hydrogen and argon (although any noble gas, such as helium, or other inert gas may be used). It has been surprisingly realised that it is possible to grow graphene without using chemical vapour deposition. It has been realised that it is possible to convert an amorphous layer of carbon into a graphene layer by depositing an amorphous layer of carbon on a catalyst and then heating the amorphous carbon and catalyst to a temperature of from around 800° C. to around 1000° C., preferably around 900° C. in order to convert the amorphous carbon into graphene.

In one method, an amorphous layer of carbon having a layer thickness in a range from 1 nm to 1000 nm, preferably in a range from 10 nm to 600 nm is deposited on a molybdenum layer and then annealed. The annealing may take place at a temperature of from around 800° C. to around 1000° C., preferably around 900° C. in order to convert the amorphous carbon into graphene. The annealing time may be in the range of 1-180 min, preferably 5-60 min. The annealing may take place in a hydrogen/argon atmosphere. The molybdenum may be supported on a silicon base layer, which may comprise silicon dioxide. The catalyst onto which the amorphous carbon is deposited may be a catalyst according to any aspect of the present invention. In this embodiment, the thickness of the catalyst or catalyst layer may be in the range from 5 nm to 1000 nm, preferably from 20 nm to 800 nm. For example, when using Cu as a catalyst, the thickness of the catalyst layer is preferably in the range from 100 nm to 1000 nm, more preferably from 400 to 900 nm to provide a thicker catalyst layer. Such catalysts layer may be applied on the top, beneath or even on both sides of the amorphous carbon layer. Note that, within the meaning of the present invention, a catalyst according to the present invention may also be referred to as a catalyst layer.

In another aspect, an amorphous layer of carbon is deposited between a base layer and a molybdenum layer. The base layer may comprise silicon, which may comprise silicon dioxide. The catalyst onto which the amorphous carbon is deposited may be a catalyst according to any aspect of the present invention.

The amorphous carbon may be deposited by any suitable method, such as, for example, sputtering. This method allows for the production of multilayer graphene without the need for CVD equipment. This method allows graphene to be produced using an annealing oven.

According to a fourth aspect of the present invention, there is provided the use of a catalyst or method according to the first, second, or third aspects of the present invention in the synthesis of graphene. Preferably, the graphene is multilayer graphene.

According to a fifth aspect of the present invention, there is provided a pellicle comprising graphene produced according to any aspect of the present invention.

The graphene produced using the catalyst of the present invention is more uniform in thickness compared the graphene produced using known catalysts. This makes the graphene eminently suitable for use in a pellicle, particularly an EUV pellicle.

The pellicle may comprise a capping layer and a pellicle core. Preferably, the capping layer substantially covers the pellicle core.

The capping layer may be any suitable material. The capping material may comprise molybdenum, aluminium, ruthenium and molybdenum, molybdenum and boron, zirconium and boron, yttrium and boron, or lanthanum and boron. The capping layer may comprise any of the aforementioned metals with boron carbide or boron nitride. The capping layer may comprise zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminium oxide.

In some embodiments the capping layer comprises boron nitride, preferably the boron nitride having a hexagonal crystal structure. In other embodiments, the boron nitride is amorphous or is cubic boron nitride. The choice of which crystal structure of boron nitride to use, namely cubic, hexagonal, or amorphous, depends on the crystal structure of the core material to provide the best match. The crystal structure can be adjusted by adjusting the deposition method and any post deposition treatment. For example, hexagonal boron nitride may be preferred for growth on graphene by means of chemical vapour deposition. Cubic boron nitride can be grown by plasma assisted vapour deposition or physical vapour deposition with subsequent plasma treatment. Cubic boron nitride will mechanically match best with cubic crystals, such as molybdenum silicide.

Boron nitride may be used to cap pellicle core materials including graphene, molybdenum silicide, molybdenum silicide nitride, zirconium silicide, zirconium silicide nitride, boron, and silicon nitride. These pellicle cores may also be capped by any of the aforementioned capping layer materials.

In some embodiments, the EUV pellicle core comprises graphene produced according to the method according to any aspect of the present invention.

According to a sixth aspect of the present invention, there is provided a EUV lithography apparatus comprising a EUV pellicle according to the fifth aspect of the present invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
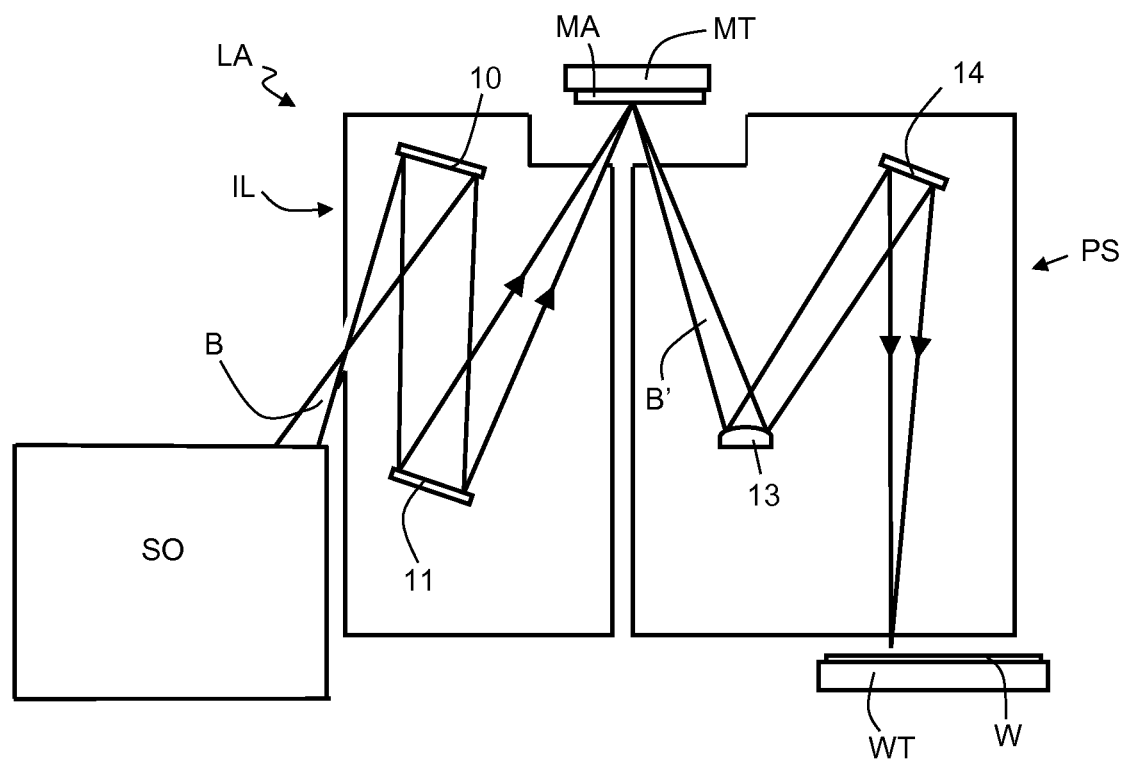
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Although EUV reticles are referred to in the following description, any suitable patterning device MA may be used.

Example of stacks preparation according to the invention: p-type Si (100) wafers having resistivity between 20-30 Ωcm covered with a film of thermally grown $SiO_2$ with thickness of 500 nm were used as base substrate. On top of the Si wafers, a double layer, either Mo on top of a-C or a-C on Mo, was deposited resulting in 4 samples. Samples 1 and 2 had Mo on top of the a-C layer. Sample 1 had a carbon layer of 500 nm and a Mo layer of 20 nm. Sample 2 had a carbon layer of 40 nm and a Mo layer of 20 nm. The order of layers in the stack of samples 1 and 2 was: Mo, a-C, SiO2, c-Si. Samples 3 and 4 had a-C on top of Mo. Sample 3 had a carbon layer of 500 nm and a Mo layer of 50 nm. Sample 4 had a carbon layer of 40 nm and a Mo layer of 50 nm. The order of layers in the stack of samples 3 and 4 was: a-C, Mo, SiO2, c-Si. The Mo and a-C layers were sputtered at room temperature from targets having purity equal to 6N5 and 4N for Mo and C, respectively. To grow graphene, a thermal anneal up to 915° C. was performed. The anneal gas consisted of an Ar and $H_2$ mixture at a pressure of 25 mbar.

The temperature profile had a ramp profile in three stages and started with a first stage slow ramp up to 915° C. in order to reduce thermal stress in the Si and Mo layers. The first stage was the fastest one with a rate of 200° C./min, rising from room temperature to 525° C. It was followed by a second stage having a slower ramp rate (50° C./min) till 725° C. The third ramp up rate was 30° C./min and lasted until the final temperature (915° C.) was reached. A 1 minute interval for temperature stabilization was included in between ramp up stages. The growth was performed at 915° C. for different time windows. The cooling down consisted of a rate of a controlled cooling rate of 25° C./min till 525° C. before completely switching off the heater. Because of the thermal inertia, the cooling down had an exponential profile. The annealing was carried out in a mixture of Ar and $H_2$. By varying the ratio of the two gases and/or the growth time, the influence of the gas atmosphere on the growth process was investigated. Table 1 shows the corresponding recipes.

It has been observed for all four samples that graphene growth happens with the catalyst layer sputtered either above or below an a-C layer. The growth mechanism consisted of the diffusion of a-C inside the catalyst layer, followed by C segregation and graphene formation on top of Mo layer. For samples 1 and 2 which started with the Mo layer on top of the a-C layer, after annealing the order of layers in the stack became: graphene, $Mo_2C$, a-C, $SiO_2$, c-Si. For samples 3 and 4 which started with the Mo layer beneath the a-C layer, after annealing the order of layers in the stack became: a-C, graphene, Mo2C, SiO2, c-Si.

TABLE 1

Recipes for graphene growth

| Recipe | Growth temperature [° C.] | Growth time [min] | Composition of Ar/$H_2$ atmosphere [sccm] |
| --- | --- | --- | --- |
| 1 | 915 | 90 | 960/40 |
| 2 | 915 | 60 | 960/40 |
| 3 | 915 | 30 | 960/40 |
| 4 | 915 | 90 | 0/1000 |
| 5 | 915 | 60 | 0/1000 |
| 6 | 915 | 30 | 0/1000 |
| 7 | 915 | 90 | 1000/0 |

The highest quality of graphene, proved through Raman spectroscopy and cross-sectional transmission electron microscopy TEM, was obtained for sample 1 with a 20 nm-thick Mo layer deposited on a 500 nm-thick a-C film. Based on Raman spectroscopy results it was found that the quality of the graphene layers was at least as good as that obtained in conventional CVD deposition with gaseous hydrocarbon sources. The minimum temperature used to grow graphene was around 900° C.

In a further embodiment of the invention, it was found advantageous to grow graphene using an intermediate anneal step, thereby splitting the anneal process in two stages: 1) a first anneal step of the stack of layers at a temperatures of around 700° C. in order to create a carbide of the transition metal catalyst; and thereafter 2) a second anneal step for growing the graphene layer by annealing the stack of layers at around 900° C. It is presumed that such an intermediate anneal step (the first anneal step) allows a better redistribution of the stresses in the stack layers.

Figure 2:
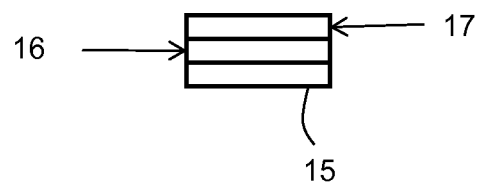
FIG. 2 depicts a schematic cross section through a catalyst according to the present invention showing an interlayer.

FIG. 2 depicts a schematic illustration of a catalyst according to the present invention. The catalyst comprises a base layer 15, an interlayer 16 and a first layer 17. The interlayer 16 is deposited between the base layer 15 and the first layer 17 such that interlayer 16 is disposed between the base layer 15 and the first layer 17.

The base layer 15 may be any suitable material, but preferably comprises silicon and more preferably is a silicon wafer. The base layer 15 may comprise a silicon dioxide layer (not shown), which may be referred to as a thermal oxide layer. The interlayer 16 and the thermal layer are preferably different.

In use, a carbon source is provided and the catalyst is heated to a temperature required to carbonise or graphitize the carbon source. As the carbon is deposited on the surface of the catalyst, it forms graphene layers. The length of time can be adjusted to result in thicker or thinner graphitic layers.

Figure 3A:
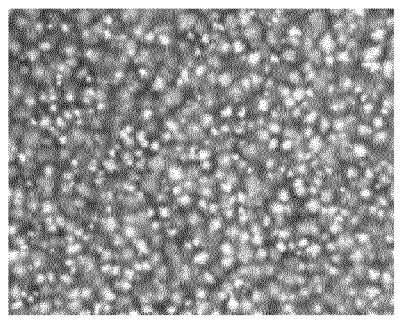
FIGS. 3a and 3b show a comparison of the surface of a multilayer graphene layer produced using a catalyst of the prior art and a catalyst according to the present invention.
Figure 3B:
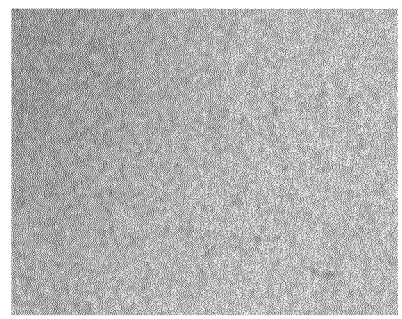

FIG. 3a shows an optical microscope image at 100× magnification of a graphene layer produced using a known catalyst without an interlayer and FIG. 3b shows an optical microscope image at 100× magnification of a graphene layer produced using a catalyst of the present invention comprising an interlayer. It is clear that the graphene produced according to the present invention shows much greater uniformity. In addition, the graphene layer is produced much more quickly than when using a catalyst of the prior art, which leads to shortened production time and decreased thermal energy requirements.

Figure 4A:
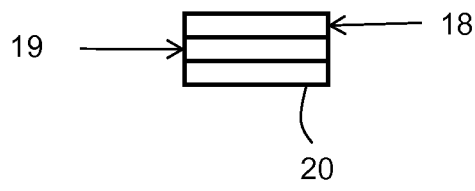
FIG. 4 depicts a schematic cross section through a catalyst comprising an amorphous carbon layer according to the present invention.
Figure 4B:
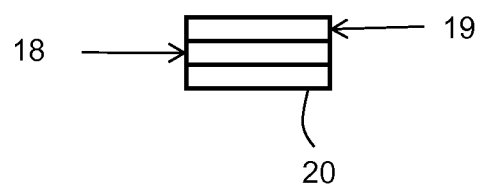

FIGS. 4a and 4b show two options for depositing amorphous carbon on a catalyst. In particular, FIG. 4a shows the embodiment in which the amorphous carbon 18 is deposited on top of a molybdenum layer 19. The molybdenum may be supported on a base layer 20 and there may be an interlayer (not shown) between the base layer 20 and the molybdenum layer 19. There may also be a thermal oxide (silicon dioxide layer) (not shown) on the surface of the base layer 20. FIG. 4b shows the embodiment in which the amorphous carbon 18 is disposed between the molybdenum layer 19 and the base layer 20, which may comprise silicon. The catalyst may be the catalyst according to any aspect of the present invention.

In use, amorphous carbon is deposited by any suitable means, such as sputtering. The catalyst comprising the amorphous carbon is heated for a period of time sufficient to result in conversion of at least a portion of the amorphous carbon into graphene.

It was found furthermore that for the graphene growth method according to the invention other transition metals, such as W, Pt, Cu and Ni, were also suitable as catalyst layers. From the point of view of graphene quality and for the pellicle fabrication process flow it was found that Mo catalysts provided especially good results.

Even more surprisingly, it was also found that in the method according to the invention it was possible to first deposit a capping layer (e.g. SiC) on the top of the stack of layers comprising a-C/Mo and then grow graphene without CVD under the capping layer. Such approach allowed eliminating the influence of the atmosphere in the deposition chamber on graphene growth. This allowed to avoid damaging of the graphene layer that could occur by deposition of the capping layer (i.e. when the capping layer would be deposited after the graphene growth). Although not yet fully understood in terms of the reaction mechanism, it was found that graphene grown under the capping layer using the method of this invention shows a higher quality, which is detected by a lower defect peak in Raman spectra. Examples of capping layers that may be applied according to the present invention include, but are not limited to capping layers comprising zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminium oxide.

Embodiments are provided according to the following clauses:

1. A catalyst comprising:
   (i) a first layer comprising a transition metal;
   (ii) a base layer; and
   (iii) an interlayer,
   wherein the interlayer is disposed between the base layer and the first layer.
2. A catalyst according to clause 1, wherein the transition metal in the first layer is selected from Mo, W, Pt, Cu or Ni.
3. A catalyst according to clause 1 or clause 2, wherein the interlayer comprises a metal oxide and/or a metal silicide and/or carbon.
4. A catalyst according to clause 3, wherein the metal oxide is zirconium dioxide.
5. A catalyst according to clause 3, wherein the metal silicide comprises molybdenum silicide.
6. A catalyst according to any of clauses 1 to 5, wherein the base layer comprises silicon.
7. A catalyst according to clause 6, wherein the base layer comprises silicon dioxide.
8. A catalyst according to clause 1, wherein the first layer comprises elemental molybdenum and/or molybdenum carbide.
9. A method of preparing a catalyst comprising:
   (i) providing an interlayer comprising a metal oxide, metal silicide, and/or carbon on a base layer; and
   (ii) providing a first layer comprising a transition metal.
10. A method according to clause 9, wherein the interlayer comprise zirconium and/or molybdenum.
11. A method according to clause 10, wherein the interlayer comprises zirconium dioxide and/or molybdenum silicide.
12. A method according to any of clauses 9 to 11, wherein at least one of the first layer and the interlayer are formed by sputtering, chemical vapour deposition, or any other suitable method.
13. A method of synthesising graphene comprising:
   (i) depositing carbon onto a surface of a catalyst according to any of clauses 1 to 12; and
   (ii) forming a graphene layer on the catalyst.
14. A method according to clause 13, wherein a carbon source is provided as a carbonaceous gas or as a stream of carbon.
15. A method according to clause 13 or clause 14, wherein the carbon layer is an amorphous carbon layer.
16. A method according to clause 13 or clause 15, wherein the catalyst layer is provided above and/or below the carbon layer.
17. A method according to any of clauses 13 to 16, wherein the carbon is deposited by a process other than chemical vapour deposition.
18. A method according to any of clauses 13 to 17, wherein the carbon layer deposited onto the surface of the catalyst is heated to form graphene.
19. A method according to clause 18, wherein the heating is done at an annealing temperature in the range from 600° C. to 1200° C.
20. A method according to clause 18 or clause 19, wherein the heating comprises a first anneal step at a temperatures of in the range of 600° C. to 800° C. in order to create a carbide of the transition metal catalyst.
21. A method according to clause 18 or clause 19, wherein the heating comprises a second anneal step at a temperature in the range of 800° C. to 1200° C., preferably in the range from 900° C. to 1100° C. in order to convert the carbon into graphene.
22. A method according to clause 13, comprising an intermediate step of providing a capping layer onto the carbon layer and catalyst layer and then forming the graphene layer beneath the capping layer.
23. A method according to clause 22, wherein the capping layer comprises at least one of molybdenum, aluminium, ruthenium and molybdenum, molybdenum and boron, zirconium and boron, yttrium and boron, or lanthanum and boron.
24. A method according to clause 22 or clause 23, wherein the capping layer comprises zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminium oxide.
25. A method according to any of clauses 13 to 24, wherein the carbon layer has a thickness in a range from 1 nm to 1000 nm, preferably in a range from 10 nm to 600 nm.
26. A method according to any of clauses 13 to 25, wherein catalyst layer has a thickness in the range from 5 nm to 1000 nm, preferably from 20 nm to 800 nm.
27. A method according to clause 26, wherein when the catalysis is Cu the thickness of the catalyst layer is in the range from 100 nm to 1000 nm, more preferably from 400 to 900 nm.
28. A method according to any of clauses 13 to 27, wherein the stack of layers obtained comprises: amorphous carbon, graphene, $Mo_2C$, $SiO_2$ and c-Si and optionally a capping layer referred to in clause 23 or clause 24.
29. The method according to clause 13, further comprising removing the graphene layer from the catalyst surface.
30. Use of a catalyst according to any of clauses 1 to 8 in the synthesis of graphene.
31. Use of a catalyst according to clause 30, wherein the graphene is multi-layer graphene.
32. A multi-layered pellicle stack comprising layers of amorphous carbon, graphene, a carbide of a transition metal, $SiO_2$ and c-Si.

33. A multi-layered pellicle stack according to clause 32, wherein the transition metal is selected from Mo, W, Pt, Cu and Ni.

34. A multi-layered pellicle stack according to clause 32 or clause 33, further comprising a capping layer.

35. A multi-layered pellicle stack according to clause 34, wherein the capping layer comprises at least one of molybdenum, aluminium, ruthenium and molybdenum, molybdenum and boron, zirconium and boron, yttrium and boron, or lanthanum and boron, such as zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminium oxide.

36. A multi-layered pellicle stack according to clause 34 or clause 35, wherein the layer of graphene is below the capping layer.

37. A pellicle comprising graphene produced according to a method according to any of clauses 13 to 29.

38. A pellicle according to clause 37 comprising a capping layer and a pellicle core, preferably wherein the capping layer substantially covers the pellicle core.

39. A pellicle according to Clause 38, wherein the capping layer comprises at least one of molybdenum, aluminium, ruthenium and molybdenum, molybdenum and boron, zirconium and boron, yttrium and boron, or lanthanum and boron, such as zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminium oxide.

40. A pellicle according to clause 38, wherein the capping layer comprises one or more of: ruthenium, molybdenum, boron, yttrium, lanthanum, boron, zirconium, carbon, niobium, silicon, aluminium, nitrogen, or oxygen.

41. A pellicle according to clause 40, wherein the capping layer is selected from one or more of: ruthenium, aluminium, ruthenium and molybdenum, molybdenum and boron, zirconium and boron, yttrium and boron, and lanthanum and boron.

42. A pellicle according to any of clauses 38 to 41, wherein the capping layer comprises boron carbide, silicon carbide and/or boron nitride.

43. A pellicle according to clause 42, wherein the capping layer comprises boron nitride.

44. A pellicle according to clause 43, wherein the boron nitride comprises a hexagonal crystal structure, a cubic crystal structure, or is amorphous.

45. A pellicle according to any of clauses 37 to 44, wherein the pellicle core comprises graphene produced according to the method of any of clauses 13 to 29.

46. A lithography apparatus comprising a pellicle according to any of clauses 37 to 45.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. In particular, features disclosed in respect of one aspect of the present invention may be combined with any other aspect of the present invention.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The invention claimed is:

1. A pellicle configured for a lithography apparatus, the pellicle comprising graphene formed by catalysis with a catalyst comprising:
   (i) a first layer comprising a transition metal;
   (ii) a base layer; and
   (iii) an interlayer,
   wherein the interlayer is disposed between the base layer and the first layer.

2. The pellicle according to claim 1, further comprising a capping layer and a pellicle core.

3. The pellicle according to claim 2, wherein the capping layer comprises at least one selected from: molybdenum, aluminium, ruthenium and molybdenum, molybdenum and boron, zirconium and boron, yttrium and boron, lanthanum and boron, zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminium oxide.

4. The pellicle according to claim 2, wherein the capping layer comprises one or more selected from: ruthenium, molybdenum, boron, yttrium, lanthanum, boron, zirconium, carbon, niobium, silicon, aluminium, nitrogen, or oxygen.

5. The pellicle according to claim 4, wherein the capping layer is one or more selected from: ruthenium, aluminium, ruthenium and molybdenum, molybdenum and boron, zirconium and boron, yttrium and boron, or lanthanum and boron.

6. The pellicle according to claim 2, wherein the pellicle core comprises the graphene.

7. The pellicle according to claim 1, comprising a carbide of the transition metal and further comprising layers of amorphous carbon, $SiO_2$ and c-Si.

8. The pellicle according to claim 7, wherein the transition metal is selected from Mo, W, Pt, Cu or Ni.

9. A lithography apparatus comprising the pellicle according to claim 1.

10. A pellicle structure comprising a catalyst, the catalyst comprising:
   (i) a first layer comprising a transition metal;
   (ii) a base layer; and
   (iii) an interlayer,
   wherein the interlayer is disposed between the base layer and the first layer, and
   wherein the pellicle is configured for a lithography apparatus.

11. The pellicle structure according to claim 10, wherein the transition metal in the first layer is selected from Mo, W, Pt, Cu or Ni.

12. The pellicle structure according to claim 10, wherein the interlayer comprises a metal oxide and/or a metal silicide and/or carbon.

13. The pellicle structure according to claim 12, wherein the interlayer comprises a metal oxide and the metal oxide is zirconium dioxide or wherein the interlayer comprises a metal silicide and the metal silicide comprises molybdenum silicide.

14. The pellicle structure according to claim 10, wherein the first layer comprises elemental molybdenum and/or molybdenum carbide.

15. The pellicle structure according to claim 10, comprising a carbide of the transition metal and further comprising layers of amorphous carbon, $SiO_2$ and c-Si.

16. A method of manufacturing a pellicle configured for a lithography apparatus, the method comprising:
   (i) providing an interlayer on a base layer, the interlayer comprising a metal oxide, metal silicide, and/or carbon; and
   (ii) providing a first layer of a catalyst comprising a transition metal, wherein the interlayer is disposed between the base layer and the first layer.

17. The method according to claim 16, further comprising depositing carbon on the catalyst and forming a graphene layer on the catalyst.

18. The method according to claim 16, wherein the transition metal in the first layer is selected from Mo, W, Pt, Cu or Ni.

19. The method according to claim 16, wherein the first layer comprises elemental molybdenum and/or molybdenum carbide.

20. The method according to claim 16, further comprising providing a capping layer, wherein the capping layer comprises at least one selected from: molybdenum, aluminum, ruthenium and molybdenum, molybdenum and boron, zirconium and boron, yttrium and boron, lanthanum and boron, zirconium boride, molybdenum boride, yttrium boride, molybdenum silicide, yttrium silicide, zirconium dioxide, molybdenum oxide, yttrium oxide, diamond-like carbon, niobium oxide, carbon nitride, silicon nitride, molybdenum carbide, zirconium carbide, yttrium carbide, silicon carbide, zirconium nitride, or aluminum oxide.

21. The method according to claim 16, comprising a carbide of the transition metal and further comprising providing layers of amorphous carbon, $SiO_2$ and c-Si.

* * * * *